(12) United States Patent
Chinnock et al.

(10) Patent No.: US 7,866,337 B2
(45) Date of Patent: Jan. 11, 2011

(54) CHEMICALLY INERT FLOW CONTROLLER WITH NON-CONTAMINATING BODY

(75) Inventors: Robert T. Chinnock, Victoria, MN (US); Clifford Miller, Bloomington, MN (US); Charles Meacham, Circle Pines, MN (US)

(73) Assignee: Entegris, Inc., Billerica, MA (US)

( * ) Notice: Subject to any disclaimer, the term of this patent is extended or adjusted under 35 U.S.C. 154(b) by 94 days.

(21) Appl. No.: 11/482,542

(22) Filed: Jul. 7, 2006

(65) Prior Publication Data

US 2007/0089788 A1  Apr. 26, 2007

Related U.S. Application Data

(60) Provisional application No. 60/697,483, filed on Jul. 8, 2005.

(51) Int. Cl.
*F16K 31/02* (2006.01)

(52) U.S. Cl. .................... 137/487.5; 137/486; 137/859; 174/254; 174/268

(58) Field of Classification Search .............. 137/487.5, 137/845, 859, 486; 29/850; 174/254, 268; 361/749–751
See application file for complete search history.

(56) References Cited

U.S. PATENT DOCUMENTS

| RE31,570 | E | * | 5/1984 | Drexel ........................ 73/202.5 |
| 4,687,020 | A | * | 8/1987 | Doyle ......................... 137/486 |
| 4,858,643 | A | * | 8/1989 | Vavra et al. .................. 137/486 |
| 4,977,916 | A | * | 12/1990 | Ohmi et al. .................... 137/8 |
| 5,325,728 | A | | 7/1994 | Zimmerman et al. |
| 5,391,874 | A | * | 2/1995 | Ellis ........................ 250/336.1 |
| 5,571,996 | A | * | 11/1996 | Swamy et al. ............... 174/261 |
| 5,672,832 | A | | 9/1997 | Cucci et al. |
| 5,693,887 | A | | 12/1997 | Englund et al. |
| 5,816,285 | A | * | 10/1998 | Ohmi et al. ............... 137/487.5 |
| 6,062,256 | A | * | 5/2000 | Miller et al. ............. 137/487.5 |
| 6,578,435 | B2 | | 6/2003 | Gould et al. |
| 6,597,580 | B2 | * | 7/2003 | Weber et al. ................ 361/750 |
| 6,612,175 | B1 | | 9/2003 | Peterson et al. |
| RE38,557 | E | | 7/2004 | Englund et al. |

(Continued)

FOREIGN PATENT DOCUMENTS

WO  WO99/30388  6/1999

(Continued)

OTHER PUBLICATIONS

Supplementary European Search Report for Application No. EP 06 78 6652, dated Aug. 28, 2008.

*Primary Examiner*—Stephen Hepperle
*Assistant Examiner*—William McCalister
(74) *Attorney, Agent, or Firm*—Patterson Thuente Christensen Pedersen, P.A.

(57) ABSTRACT

A flow controller including a unitary controller body with a chemically inert fluid conduit having an insertable constriction or orifice disposed within the conduit having a reduced cross-sectional area to thereby restrict the flow of fluid within the conduit allowing for reliable flow measurement. An integrated circuit or controller may be coupled to the control valve and also coupled to the pressure sensors by a lead structure including signal conductors surrounded by a Faraday cage, and a chemically inert housing coupled to the unitary controller body enclosing the control valve and the pressure sensors.

19 Claims, 14 Drawing Sheets

U.S. PATENT DOCUMENTS

| | | |
|---|---|---|
| 6,813,964 B1 | 11/2004 | Clark et al. |
| 6,870,794 B2 | 3/2005 | Healey |
| 7,155,983 B2 | 1/2007 | Wehrs et al. |
| 7,415,894 B2 | 8/2008 | Nielsen |
| 2003/0075349 A1 | 4/2003 | Kruse et al. |
| 2005/0039947 A1 | 2/2005 | Ohsaka |
| 2005/0051215 A1 | 3/2005 | Nugent et al. |
| 2007/0163359 A1 | 7/2007 | Nielsen |

FOREIGN PATENT DOCUMENTS

| | | |
|---|---|---|
| WO | WO2004/083786 A2 | 9/2004 |
| WO | WO2005/050546 A2 | 6/2005 |

* cited by examiner

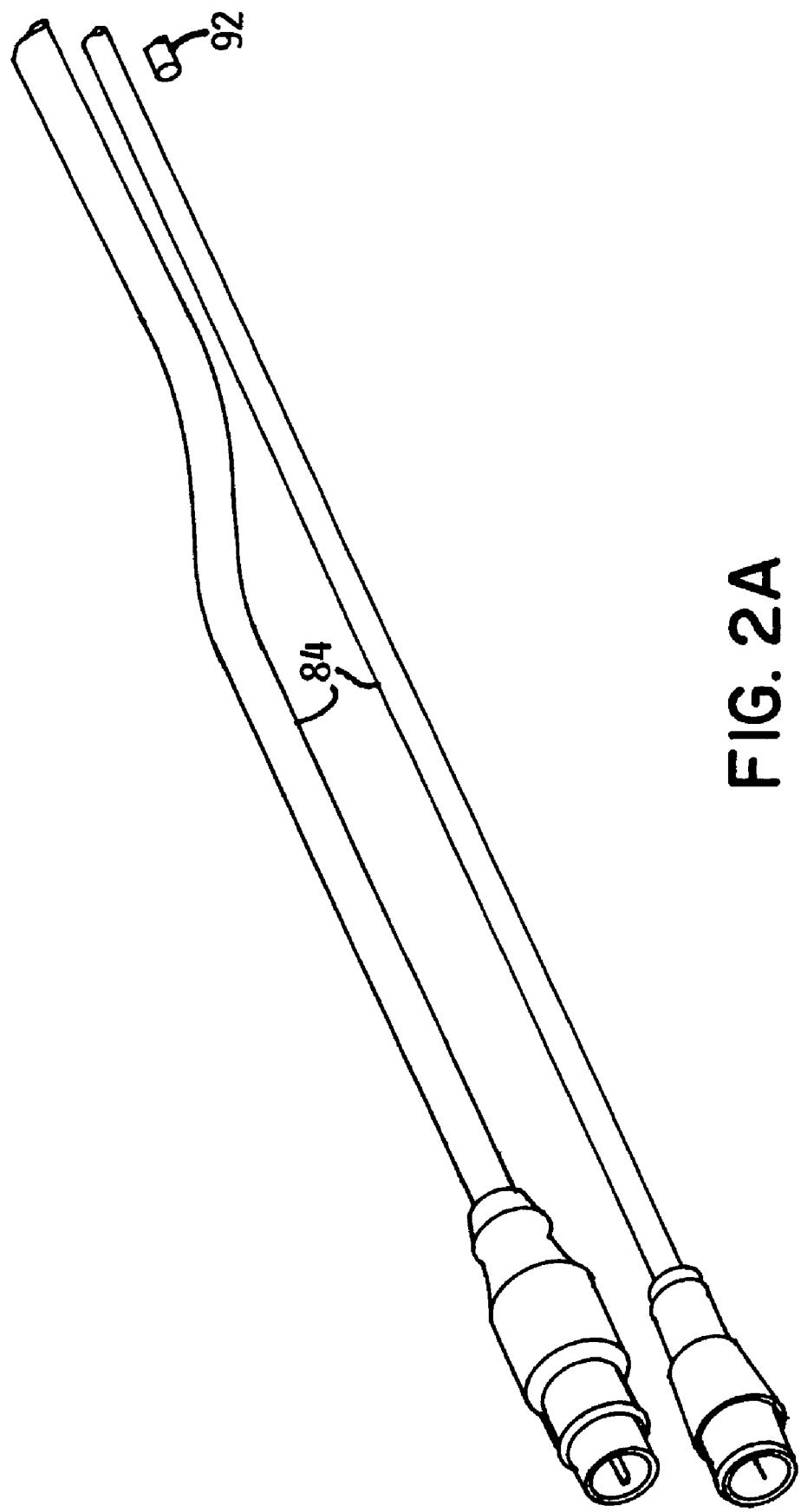

CHEMICALLY INERT FLOW CONTROLLER WITH NON-CONTAMINATING BODY

RELATED APPLICATIONS

This application claims the benefit of U.S. Provisional Patent Application No. 60/697,483 entitled CHEMICALLY INERT FLOW CONTROL WITH NON-CONTAMINATING BODY, filed Jul. 8, 2005, and hereby fully incorporated herein by reference.

FIELD OF THE INVENTION

The invention relates generally to fluid flow controllers and more particularly relates to a chemically inert fluid flow controller module that may be connected in-line within a chemically corrosive fluid flow circuit that delivers fluids in either a liquid or gaseous state.

BACKGROUND OF THE INVENTION

The susceptibility to contamination during ultra pure processing of sensitive materials such as semiconductors is a significant problem faced by manufacturers. Since the processing of the sensitive materials often involves direct contact with process fluids, it is critical that the process fluids are delivered to the processing site in an uncontaminated state and without foreign particulates. Various manufacturing systems have been designed to reduce the contamination of the sensitive materials by foreign particles and vapors generated during the manufacturing process.

The processing equipment typically includes liquid transporting systems that carry the process fluids, which are often caustic or hazardous, from supply tanks through pumping and regulating stations and through the processing equipment itself. The liquid chemical transport systems include pipes, tubing, monitoring devices, sensing devices, valves, fittings and related devices, and conventionally used metal parts which are susceptive to the corrosive environment when exposed for long periods of time. Hence, the monitoring and sensing devices typically incorporate substitute materials, such as plastics resistant to deteriorating effects of the caustic chemicals, or remain isolated from the caustic fluids.

Semiconductor manufacturing processes may require the discharge of very precise quantities of fluids and commonly use one or more monitoring, valving, and sensing devices in a closed loop feedback relationship to monitor and control this highly sensitive process. These monitoring and sensing devices must also be designed to eliminate any contamination that might be introduced. In order to control the flow or pressure within the fluid transporting system, the transporting equipment may utilize information obtained from each of the monitoring, valving and sensing devices. The accuracy of the information obtained from each of the devices may be affected by thermal changes within the system. Further, the inaccuracy of one device may compound the inaccuracy of one of the other devices that depends upon information from the one device. Further, frequent independent calibration may be required to maintain the accuracy of each individual device. Independent calibration of the devices, however, may prove difficult and time consuming.

These monitoring and sensing devices commonly control the flow or pressure within the fluid transporting system by measuring the differential pressure flow across a constricted area or orifice. Over the passage of time, an orifice invariably erodes or clogs requiring replacement of the entire monitoring and sensing device. Also, it may be desirable to increase or decrease the constricting area of the orifice within the fluid flow circuit to control the flow or pressure of the same or different fluids.

Hence, there is a need for a non-contaminating fluid control module which may be positioned in-line within a fluid flow circuit carrying corrosive materials, wherein the module is capable of determining the rate of flow based upon a pressure differential measurement taken in the fluid flow circuit, and wherein the determination of the rate of flow is not adversely affected by thermal changes within the fluid flow circuit, and wherein calibration of the pressure sensors of the fluid control module does not require ancillary or independent calibration of the valve. A need also exists for a fluid control module that avoids the introduction of particulates, unwanted ions, or vapors into the flow circuit. There is also a need for a fluid control module with a removable or replaceable orifice to eliminate replacement of an entire module or for allowing field selectable calibration of different fluid types or viscosities. Further, there is a need for a reduction in the size and weight of a fluid control module to preserve the often-valuable space in such processing systems. Thus, the embodiments of the present invention are directed to a fluid control module that seeks to overcome these and certain other limitations of the prior art.

SUMMARY OF THE INVENTION

The present invention provides a fluid control module that may be coupled in-line to a fluid flow circuit that transports corrosive fluids, where the fluid control module may determine the pressure, flow rate, and temperature and also control the pressure, flow, or volume within the fluid flow circuit. The rate of flow may be determined from a differential pressure measurement taken within the flow circuit, and preferably from a differential pressure measurement taken across a constricted area of the fluid flow conduit or orifice located between two pressure transducers in the fluid control module.

In an embodiment, a flow controller includes a unitary controller body with a chemically inert fluid conduit through which the corrosive fluids flow, an adjustable control valve coupled to the conduit, pressure sensors or transducers coupled to the conduit, an insertable constriction or orifice disposed within the conduit having a reduced cross-sectional area to thereby restrict the flow of fluid within the conduit allowing for reliable flow measurement, an integrated circuit or controller coupled to the control valve and also coupled to the pressure sensors by a lead structure including signal conductors surrounded by a Faraday cage, and a chemically inert housing coupled to the unitary controller body enclosing the control valve and the pressure sensors.

In an embodiment, the housing contains a vent plug that allows the passage of gases but not liquids, which provides venting of an internal area of the housing for true atmospheric pressure reference while restricting the flow of liquids into the internal area of the housing. Each pressure sensor also contains a vent tube that opens to the vented internal area of the housing, which allows for true atmospheric reference.

A fluid handling device according to an embodiment of the invention may include a body formed from chemically inert material and defining a flow passage therethrough, a processor with associated control logic, and at least one sensor in fluid communication with the flow passage, wherein the sensor selectively delivers a signal indicative of a condition of fluid in the flow passage. A lead structure electrically communicatively couples the processor and the at least one sensor to transmit the signal from the at least one sensor to the processor. The lead structure includes a trace layer including a shielding conductor substantially circumscribing at least one signal conductor, the trace layer presenting a pair of opposing surfaces, and a pair of shielding layers formed from conductive material, each of the shielding layers confronting a separate one of the opposing surfaces of the trace layer, the pair of shielding layers being electrically coupled with the shielding conductor of the trace layer, whereby the shielding layers and the shielding conductor of the trace layer define a Faraday cage around the at least one signal conductor to isolate the at least one signal conductor from electromagnetic interference.

A flow controller according to an embodiment of the invention includes a body formed from chemically inert material and defining a flow passage therethrough, the flow passage having a wall surface and a pair of opposing ends, the wall surface of the flow passage defining a stop structure intermediate the opposing ends with a first portion of the flow passage extending from a first one of the opposing ends to the stop structure and a second portion of the flow passage extending from the other of the opposing ends to the stop structure. An insert defining an orifice for constricting fluid flow through the flow passage is disposed in the first portion of the flow passage abutting the stop structure. The insert is selectively removable through the first end of the flow passage. The flow controller further includes a first pressure sensor in fluid communication with the first portion of the flow passage, a second pressure sensor in fluid communication with the second portion of the flow passage, a control valve in fluid communication with the flow passage and arranged so as to be operable to modulate fluid flow through the flow passage, and a processor and associated control logic communicatively coupled with the first and second pressure sensors and the control valve, wherein the processor automatically operates the control valve to modulate fluid flow through the flow passage based on signals from the first and second pressure sensors.

An object and feature of certain embodiments that it provides a cost-efficient method of extending the lifetime of the flow control module by allowing replacement of the orifice that may erode or clog over the passage of time and use.

Still another object and feature of certain embodiments of the present invention is the use of a replaceable orifice in the fluid flow conduit that allows the controller body to be constructed of a single unitary piece.

Still another object and feature of certain embodiments of the present invention is that a replaceable orifice in the fluid flow conduit allows providing the desired constricted area for differential pressure measurements for the respective fluid and flow rate while providing a material compatible with the respective fluid.

Still another object and feature of certain embodiments of the present invention is that a lead structure including signal conductors surrounded by a Faraday cage couples the processor and associated control logic to the pressure sensors to inhibit electromagnetic interference (EMI) with the signals and to provide a flow control module that is smaller, lighter, and more cost-effective.

A further object and feature of certain embodiments of the present invention involves providing a chemically protected internal area of the control module housing while still providing a true atmospheric pressure reference in the same internal area of the housing.

A further object and feature of certain embodiments of the present invention is that one flow control module may provide temperature, pressure, and flow output.

A further object and feature of certain embodiments of the present invention is that the flow control module may provide field selectable calibration of different fluid types and fluid viscosities.

Yet another object and feature of certain embodiments of the present invention includes providing a fluid control module that avoids the introduction of particulates, unwanted ions, or vapors into the flow circuit.

Those skilled in the art will further appreciate the above-mentioned advantages and superior features of the invention together with the other important aspects thereof upon reading the detailed description, which follows in conjunction with the drawings.

BRIEF DESCRIPTION OF THE DRAWINGS

FIG. 2A is a fragmentary perspective view of the electrical connector portion of the flow controller depicted in FIGS. 1 and 2;

DETAILED DESCRIPTION OF THE INVENTION

Figure 1:
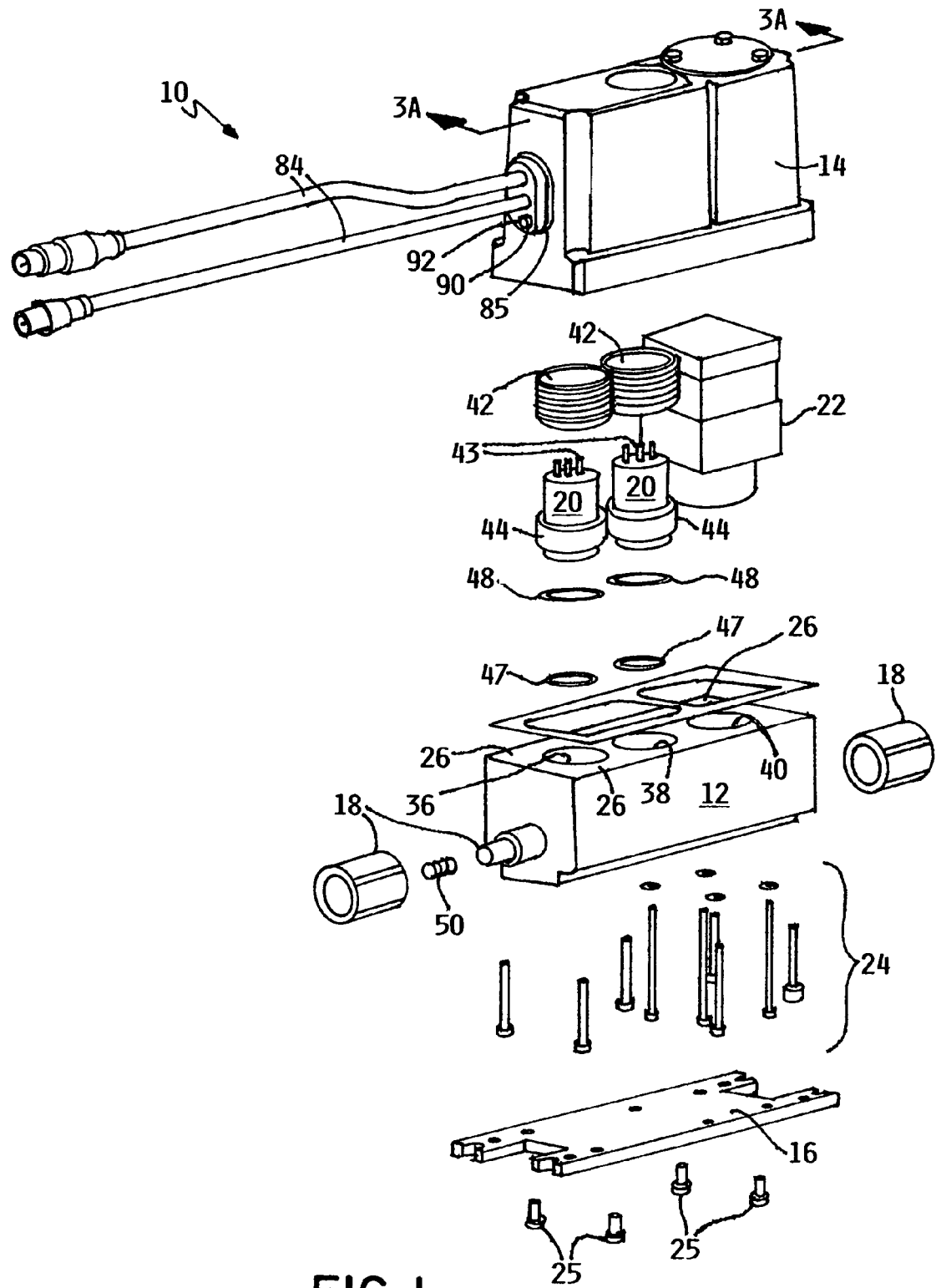
FIG. 1 is a perspective exploded view of a flow controller in accordance with an embodiment of the present invention.
Figure 2:
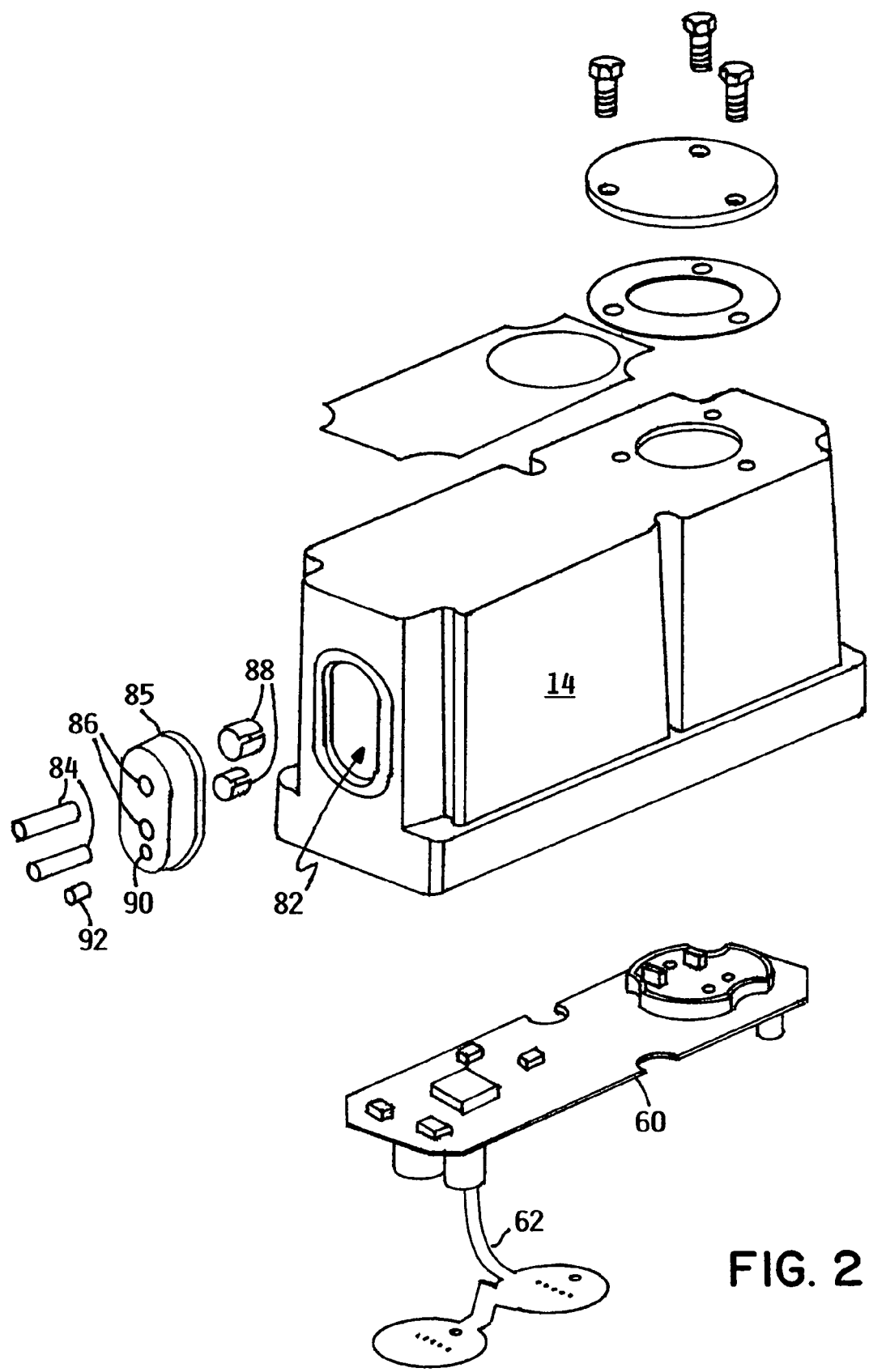
FIG. 2 is a perspective exploded view of a flow controller housing portion in accordance with an embodiment of the present invention.

Referring now generally to FIGS. 1-4, there is shown a fluid flow control module 10 for delivering the desired quantity of fluid, which may be corrosive, in either a liquid or gaseous state. The fluid control module 10 generally includes a controller body 12, a housing 14, mounting plate 16, pressure inlet/outlet fittings 18, pressure transducers or sensors 20, a control valve 22, and integrated circuit or controller 60. The controller body 12 and housing 14 are preferably manufactured from a chemically-inert, non-contaminating polymer such as polytetrafluoroethylene (PTFE), although other materials having similar chemically inert properties may also be used. The housing 14 and controller body 12 are mounted together by fasteners 24 extending through bores 26. A gasket 28 of known suitable construction is preferably positioned between housing 14 and controller body 12 and providing an airtight seal. Controller body 12 and mounting plate 16 are also preferably secured together by fasteners 25. General aspects of some of the described components and variations thereof are described in greater detail in U.S. Pat. No. 6,578,435, which is assigned to the same assignee as the present application, the entire disclosure of which is incorporated herein by reference.

Figure 3A:
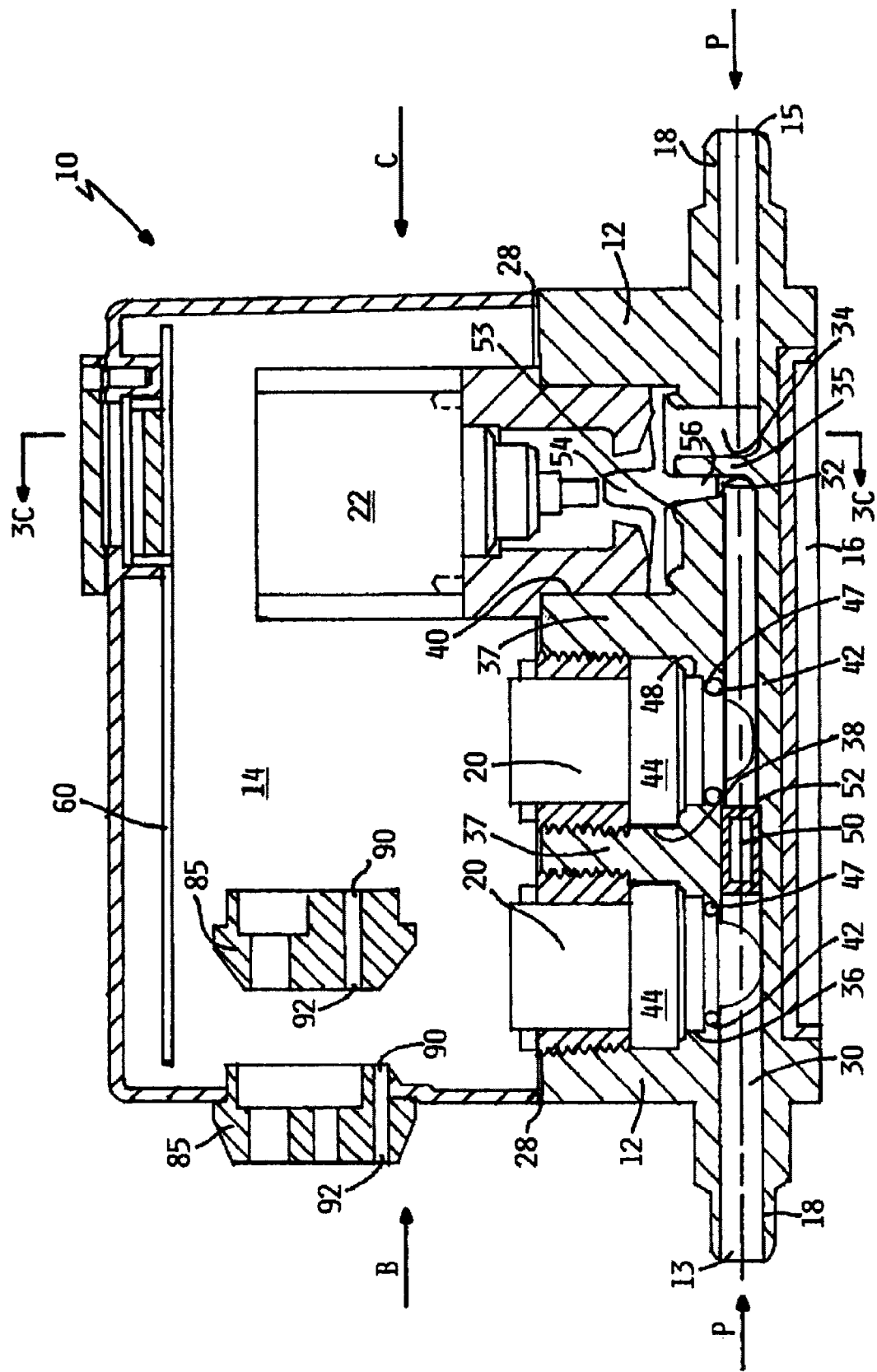
FIG. 3A is a cross-sectional view of a flow controller in accordance with an embodiment of the present invention, taken at section 3A-3A of FIG. 1.
Figure 3B:
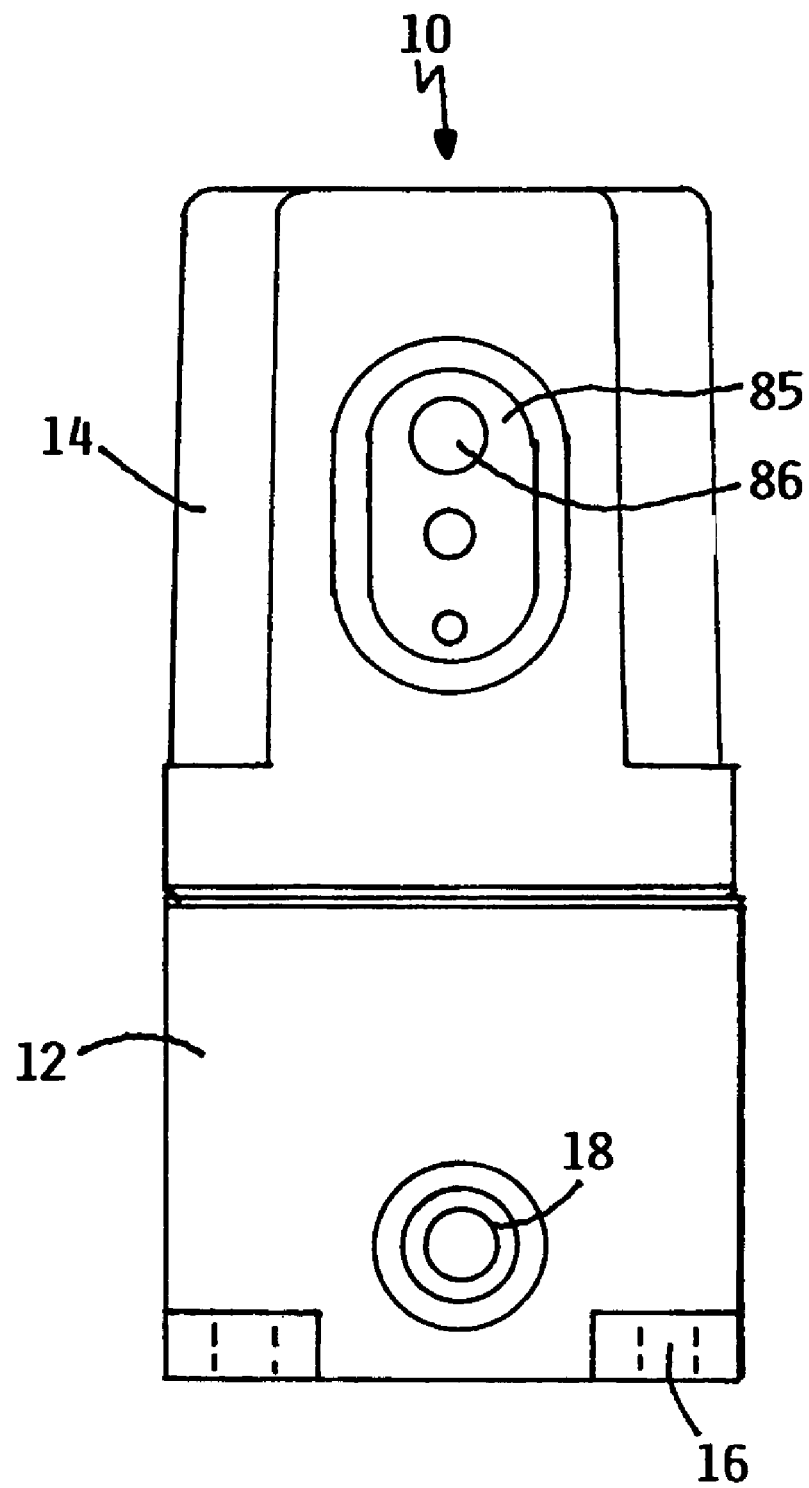
FIG. 3B is an end elevation view of the flow controller of FIG. 3A.
Figure 3C:
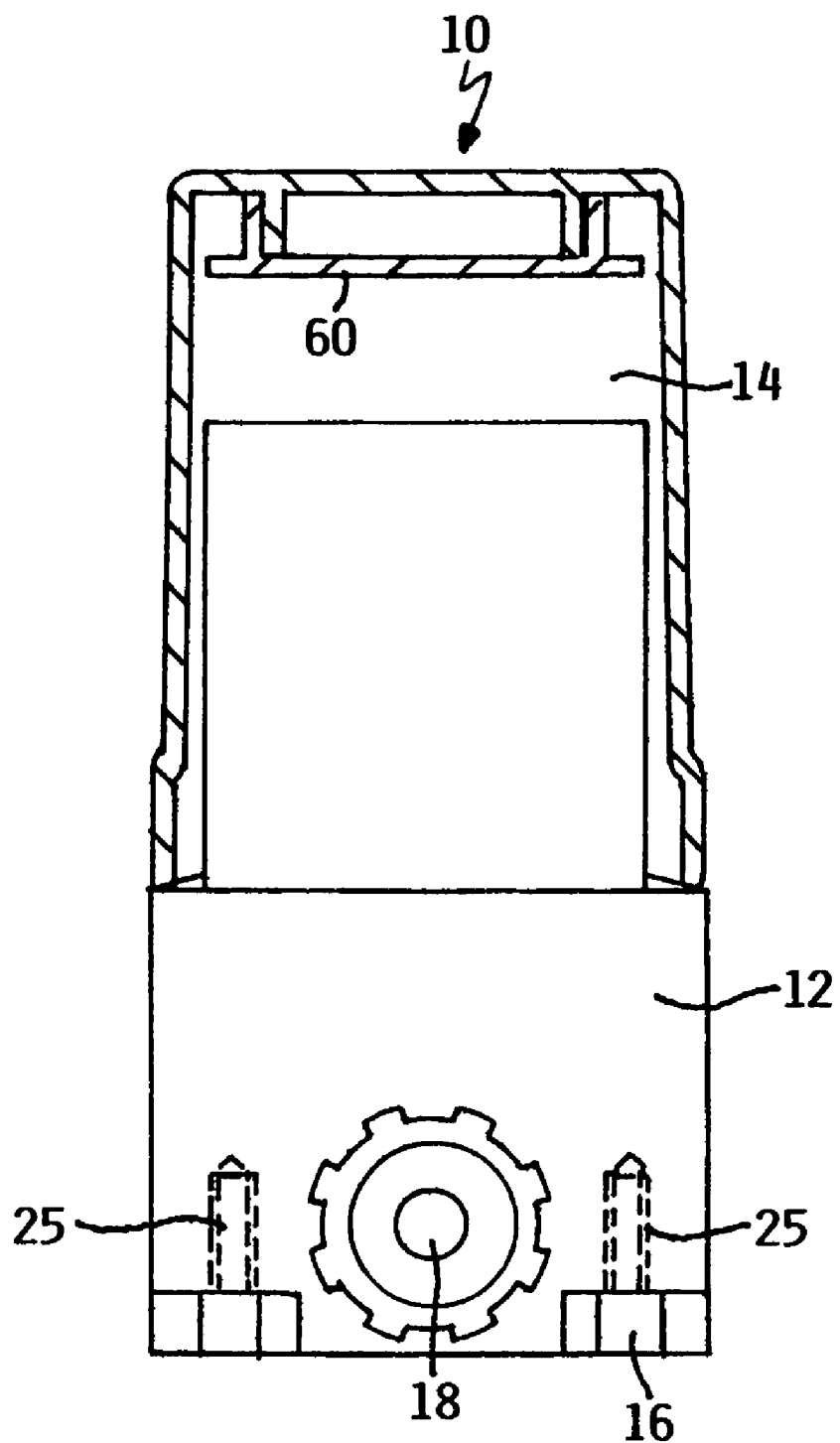
FIG. 3C is a cross-sectional view of the flow controller of FIG. 3A taken at section 3C-3C.

Referring now to FIG. 3A, a flow passage 30 extends from the proximate end 13 of controller body 12 to proximate control valve inlet/outlet bore 32. The flow passage 30 also extends from the distal end 15 of controller body 12 to the distal control valve inlet/outlet bore 34. As depicted in FIG. 3A, flow passage 30 does not extend through the entire controller body 12 in plane P from the proximate end 13 to the distal end 15. Instead, a controller body plug 35 separates the flow passage 30 causing any fluid flow to be diverted through inlet/outlet bores 32 and 34. When control valve 22 is inserted into its respective position, which will be discussed further below, the flow passage 30 and inlet/outlet bores 32 and 34 serve as the fluid flow passage within the fluid flow circuit. In an embodiment, the orientation of the fluid control module 10, within the fluid flow circuit, may be reversed without affecting its effectiveness.

As shown in FIGS. 1 and 3A, cylindrical cavities 36, 38, and 40 extend from the outer surface of the controller body 12 to the flow passage 30. Those skilled in the art will appreciate that cavities 36, 38, and 40 may each extend into the controller body 12 from different sidewalls of the controller body 12. Cavities 36 and 38 are separated a predetermined distance by dividing wall 37, and cavities 38 and 40 are separated a predetermined distance by dividing wall 39.

Near the region within the controller body 12 where each of cavities 36 and 38 intersect with flow passage 30, an annular lip 42 is formed. Lip 42 surrounds and further defines the opening to each cavity 38 and 40 from flow passage 30. Each pressure sensor 20 is held in place within their respective cavities by spacer ring 44 and externally threaded hold down ring 46. The pressure sensors 20 are sealed within the controller body 12 by chemically inert o-ring seals 47. A redundant seal may be created by the positioning of o-ring seal 48. The seals 47 and 48 are readily available and of known construction to those of ordinary skill in the art.

In flow passage 30 between the pressure sensors 20, a constriction 51 is defined by insert 50 to create a pressure drop as the fluid flow traverses the chemically inert constriction 51. Insert 50 may be formed from PTFE or other chemically inert polymer material, although other chemically inert materials are also contemplated such as sapphire, which is also resistant to wear when subjected to caustic fluids. Insert 50 may also be constructed of other materials that are compatible with the respective fluid flowing through conduit 30 and constriction 51 in fluid control module 10. In certain embodiments, insert 50 is removable so that an eroded or clogged constriction 51 can be replaced or an insert 50 having a different size constricting area can be used. In order to make an insert 50 removable, the cross-sectional area of flow passage 30 may be slightly larger in the area extending from end 13 to the area between the two pressure sensors 20 than the cross-sectional area of flow passage 30 extending from the area between the two pressure sensors 20 to controller body plug 35. This difference in the cross-sectional area of the two portions of flow passage 30 may form a stop structure in the form of annular lip 52, which prevents insert 50 from being inserted past the desired location in flow passage 30. An insertable/removable insert 50 also enables the controller body 12 to be constructed of a single unitary piece. In certain embodiments, a rotatable manifold containing multiple constrictions 51 may be found in the area of dividing wall 37. The constrictions 51 in the rotatable manifold may have the same or different constricting area size. A rotatable constriction manifold also enables the user to readily change the flow rate and/or replace the constriction after it becomes eroded or clogged.

In the region within the controller body 12 where cavity 40 interconnects with flow passage 30, a valve seat 53 is formed within the fluid conduit. While FIG. 3A illustrates a control valve 22 with a diaphragm 54 having a conical member 56 for opening and closing flow through conduit 30, those skilled in the art will appreciate that any various mechanisms for controlling flow through conduit 30 are readily available and of known construction to those of ordinary skill in the art. Further, the actuation of the valve between the open and closed position may be accomplished with any of several mechanical, electrical, or pneumatic drivers of known suitable construction.

The controller 60 may be in any of several forms including a dedicated solid-state device or a processor with associated control logic, and may include Read Only Memory (ROM) for storing programs to be executed by the processor and Random Access Memory (RAM) for storing operands used in carrying out the computations by the processor. The controller 60 is electrically coupled to a power supply and manipulates the electrical circuitry for sensing pressure and controlling the actuation of the control valve, wherein flow, pressure and/or volume may be controlled. In certain embodiments, the controller 60 is mounted to the interior top portion of the housing 14.

The controller 60 is used to convert the pressure readings from the two pressure sensors 20 to an analog or digital representation of flow or, alternatively, a pressure reading of the downstream pressure transducer. The raw analog signal from the upstream transducer is supplied to an input terminal and, likewise, the raw analog transducer output signal from the downstream transducer is supplied to an input terminal. The controller 60 computes the instantaneous pressure differences being picked up by the upstream and downstream transducers and performs any necessary zeroing adjustments and scaling. The controller 60 may also receive a signal corresponding to the temperature of the fluid flowing through flow passage 30, which may be measured by a temperature sensor located in the pressure sensors 20, diaphragm 54 of control valve 22, or a separate temperature sensor, such as one sealed in a bore located in dividing wall 39. Such measurements allow the potential for the measurement of temperature, pressure, and flow output in one fluid control module 10. Additionally, such information provides the option of field selectable calibration for different fluid types and velocities.

In certain embodiments, a lead structure 62 routes low voltage electrical magnetic interference (EMI) susceptible signals from each of the pressure sensors 20 to the controller 60. The lead structure 62 is constructed of multiple layers forming a flexible Faraday cage. While providing the necessary shielding from electrical magnetic interference, the lead structure 62 also eliminates shielding material in the housing, enabling the flow control module 10 to be smaller, lighter, and more cost-effective.

As depicted in FIGS. 5A-5G, lead structure 62 generally includes an outer polymer layer 70, a first shielding layer 72, a trace layer including grounds on either ends 74, a second shielding layer 76, a stiffener layer 78, and a second outer polymer layer 80. The small end 120 of lead structure 62 defines apertures 122 which are received on, and electrically connect with, connection pins (not depicted) extending from controller 60. In similar fashion, each of connection pads 124, 126, define apertures 128, which are received on, and electrically connect with, connection pins (not depicted) extending from each of pressure sensors 20. Lead structure 62 is preferably sufficiently flexible and resilient so as to enable it to be easily folded inside the housing. Generally, an overall thickness of 0.020 in flex areas is preferred. In an embodiment, polymer layers 70, 80, are polyimide.

Shielding layers 72, 76, generally include a thin layer of metallic material 130, preferably copper, on an insulative polymer substrate 132. Trace layer 74 generally includes a polymer substrate 133 with an outer strip 134 of metallic material circumscribing one or more signal conductors 136. When shielding layers 72, 76, are bonded on opposing surfaces 138, 140, of trace layer 74, outer strip 134 is electrically conductively connected with the layer of metallic material 130 of each of shielding layers 72, 76, to surround signal conductors 136 with a Faraday cage.

Stiffener layer 78 generally includes a layer of polymer material that may be slightly thicker and less resilient than the other layers to add strength and stiffness to the lead structure 62. Outer polymer layers 70, 80, may be applied to form the outer surfaces of lead structure 62 for protection and durability.

Figure 4:
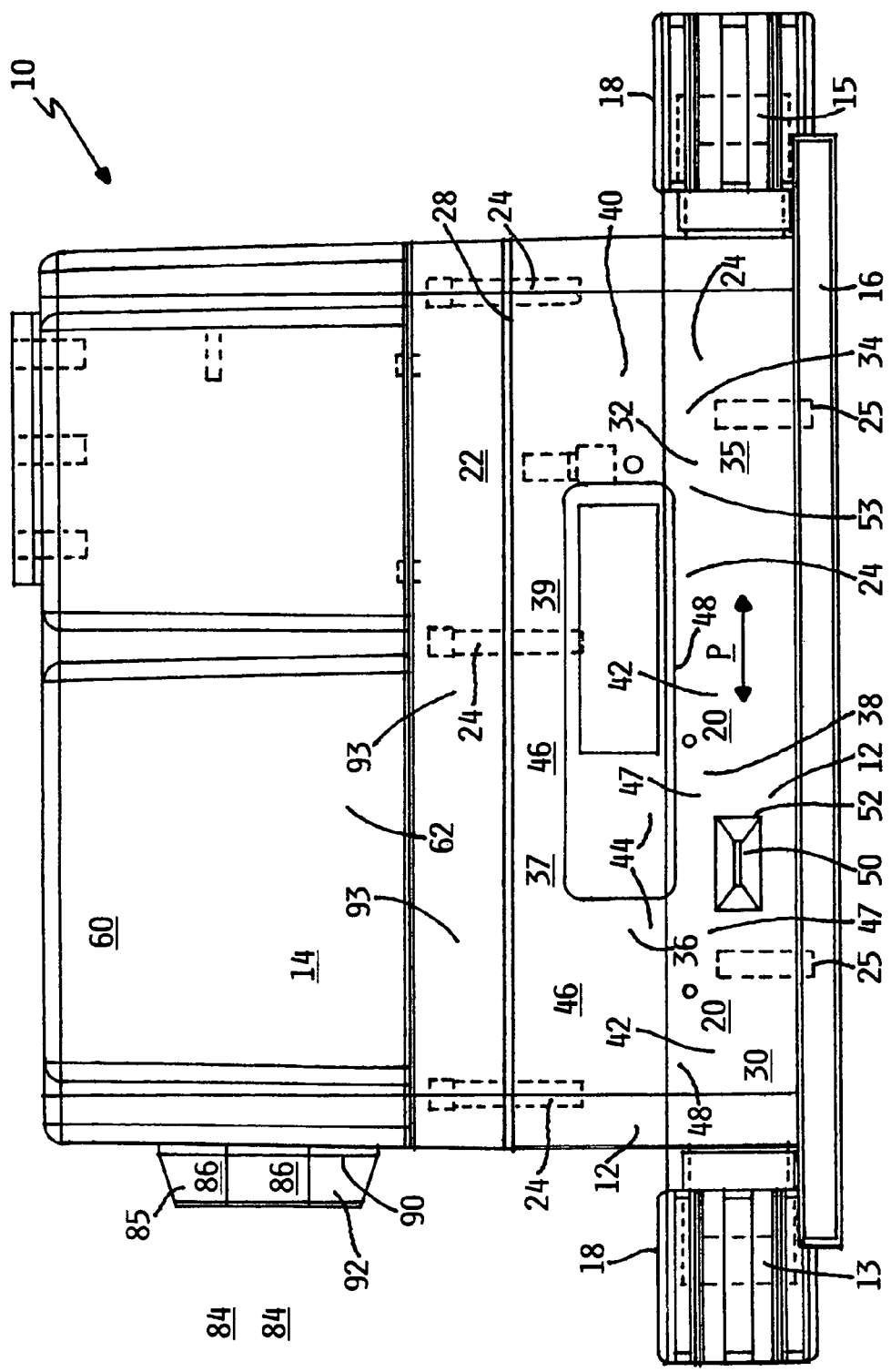
FIG. 4 is a side elevation view of a flow controller in accordance with an embodiment of the present invention.
Figure 5A:
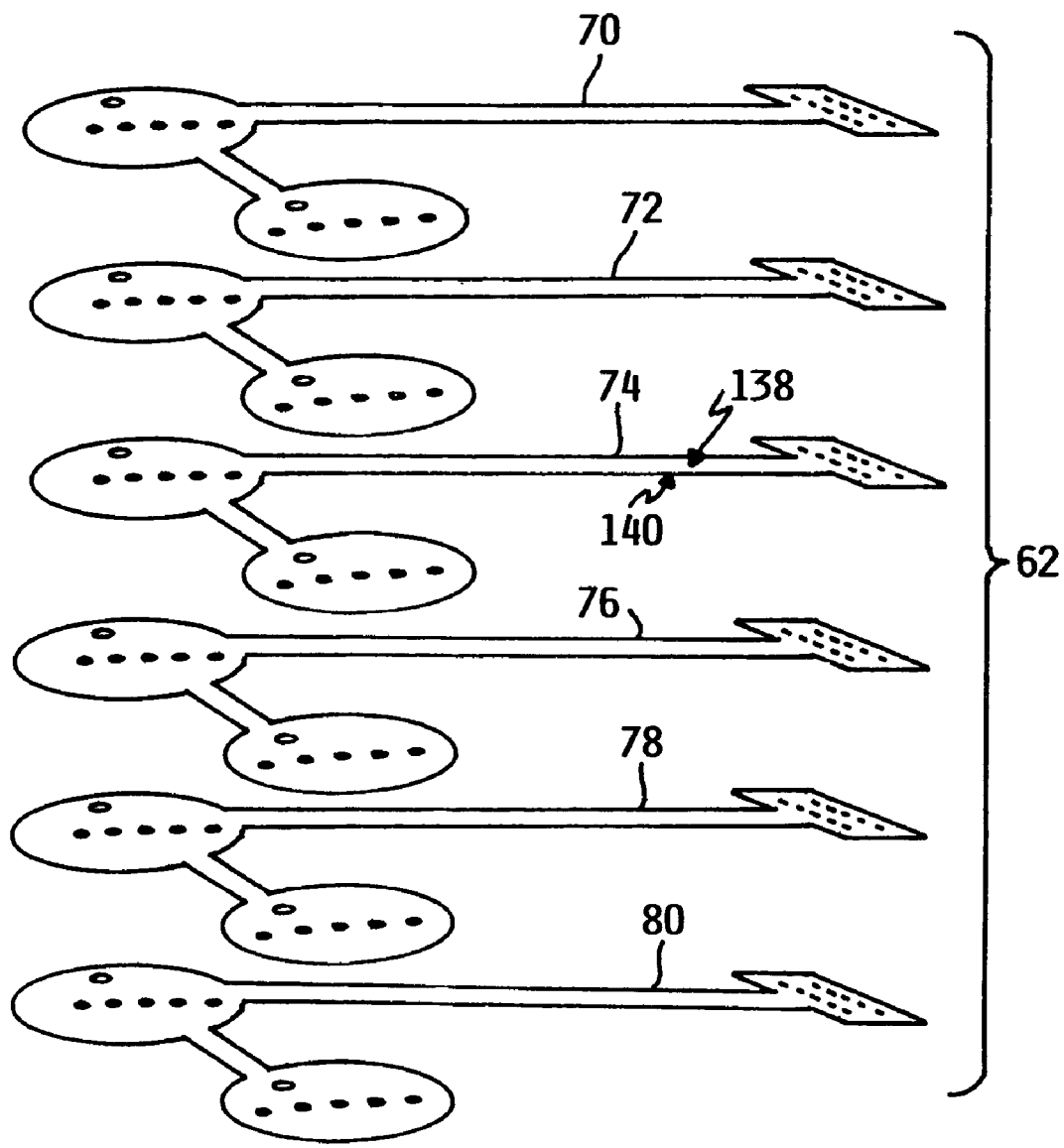
FIG. 5A is an exploded view of a lead structure in accordance with an embodiment of the present invention.
Figure 5B:
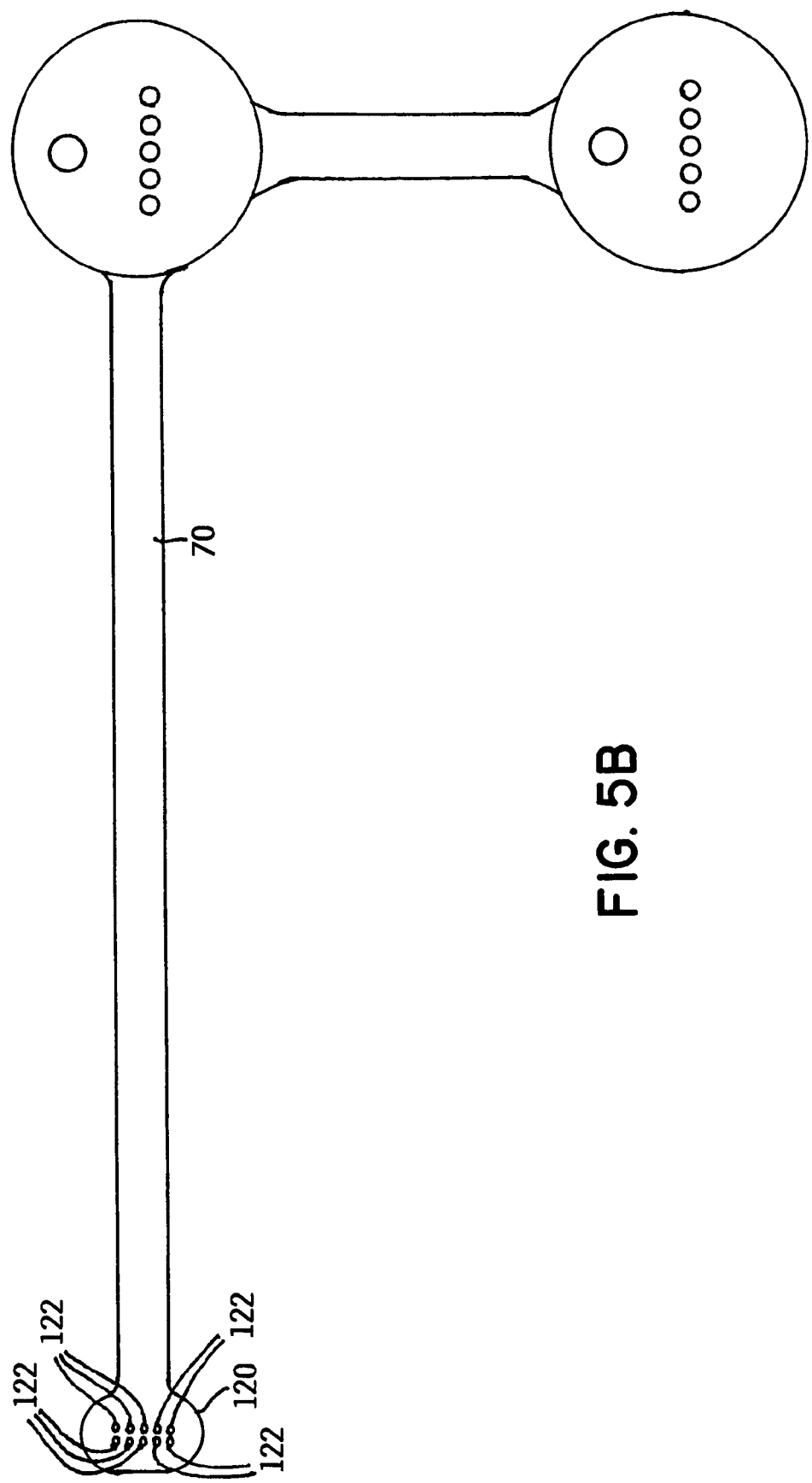
FIG. 5B is a plan view of the outer polymer layer of the lead structure of FIG. 5A.
Figure 5C:
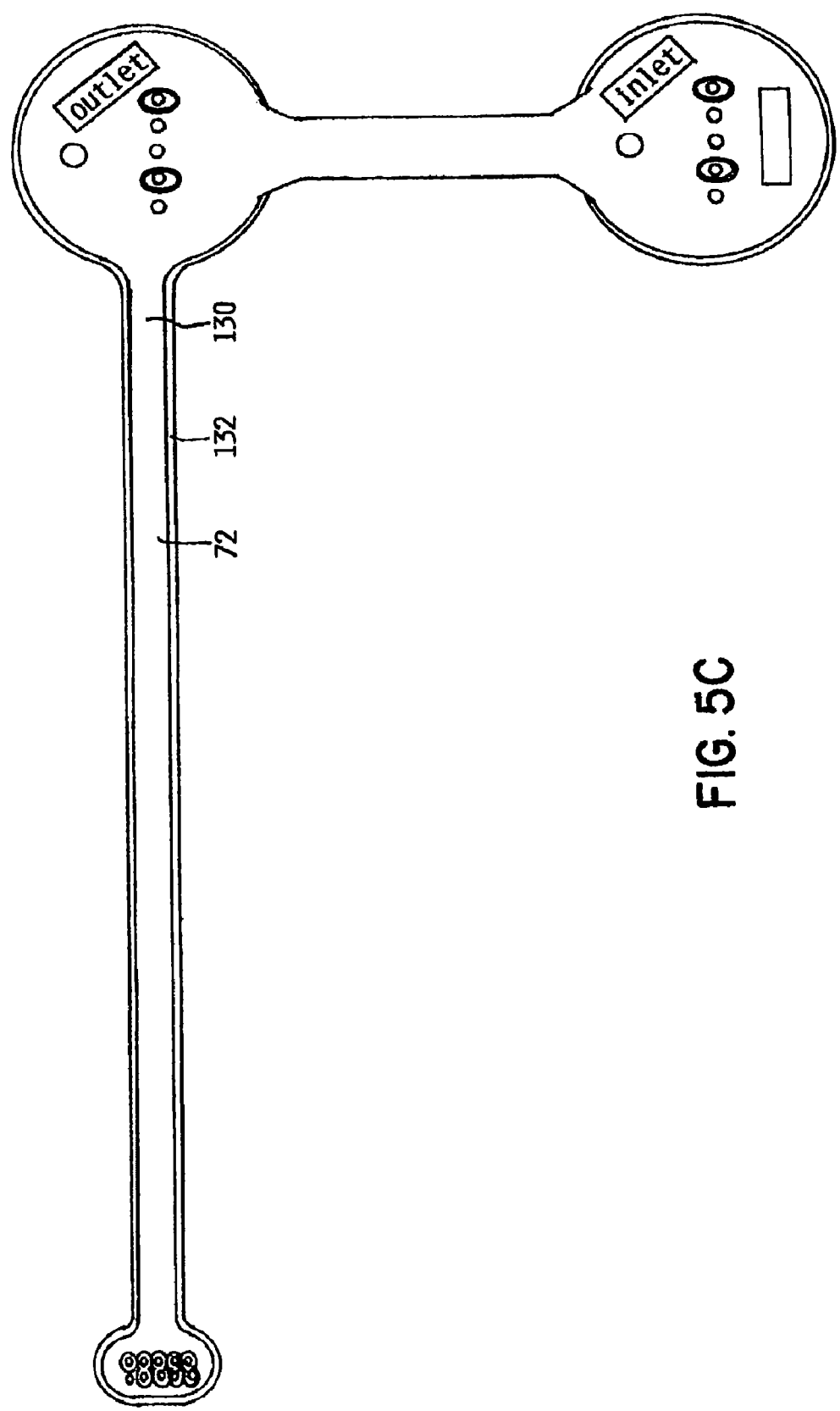
FIG. 5C is a plan view of the copper layer of the lead structure of FIG. 5A.
Figure 5D:
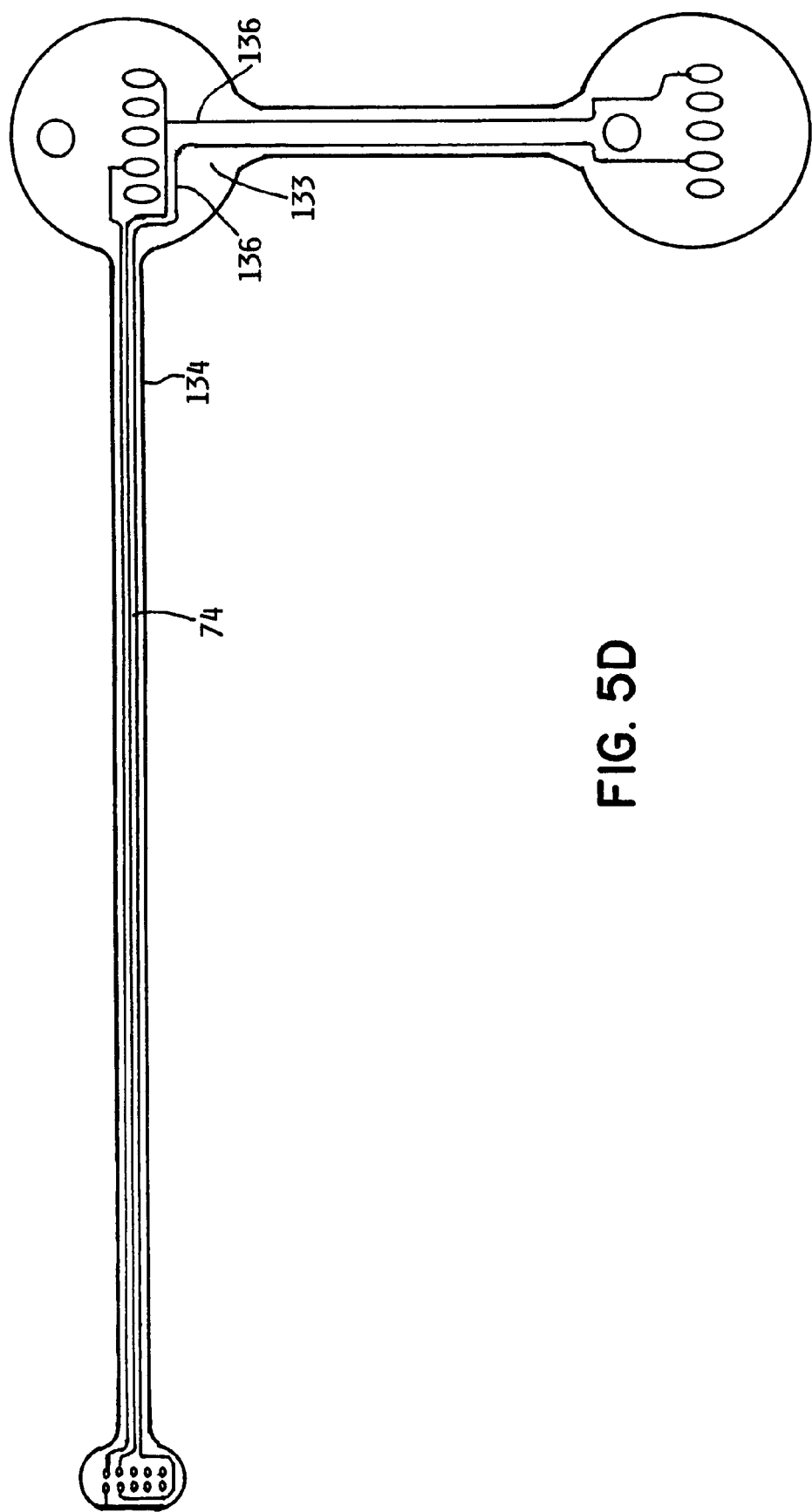
FIG. 5D is a plan view of the trace layer of the lead structure of FIG. 5A.
Figure 5E:
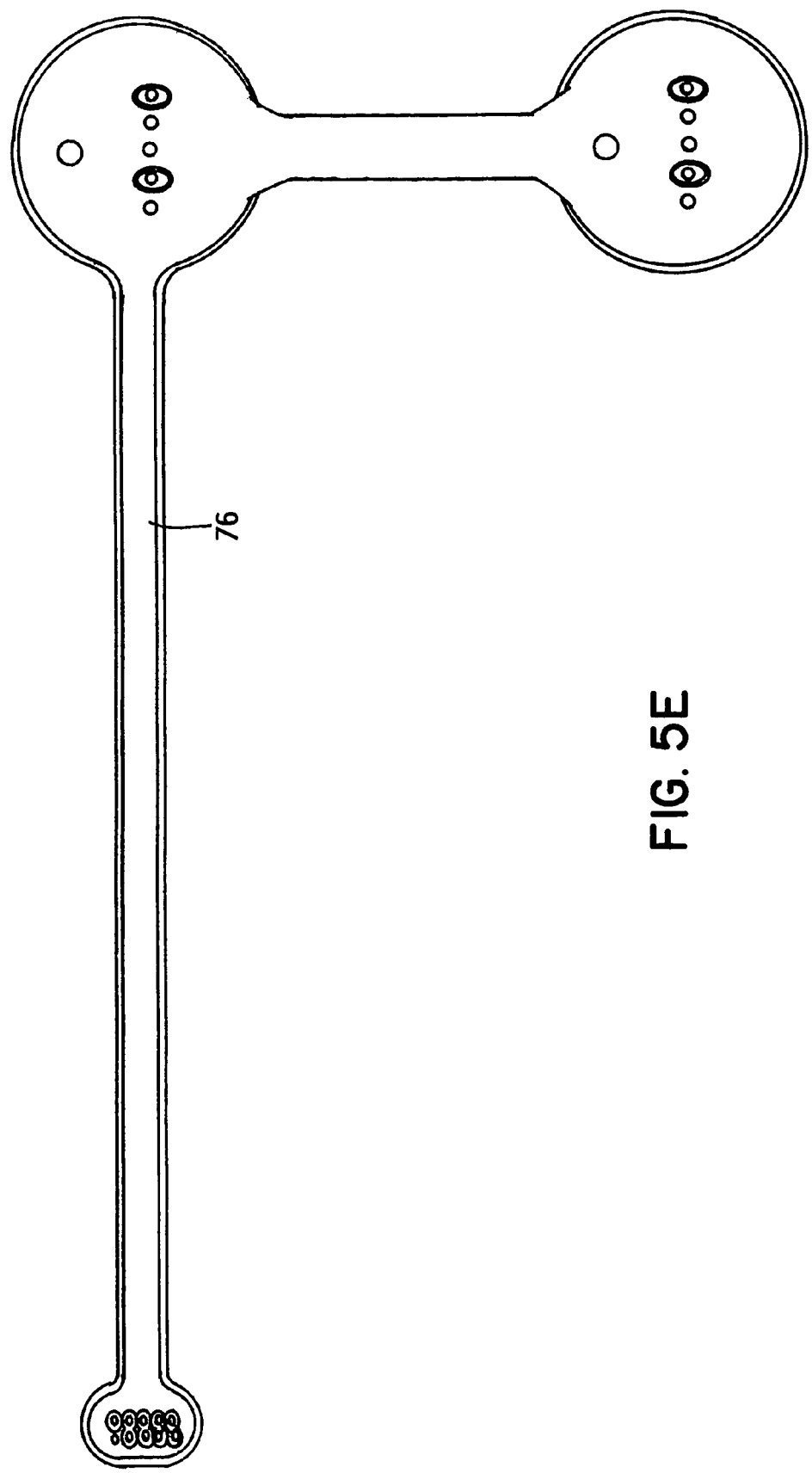
FIG. 5E is a plan view of a second copper layer of the lead structure of FIG. 5A.
Figure 5F:
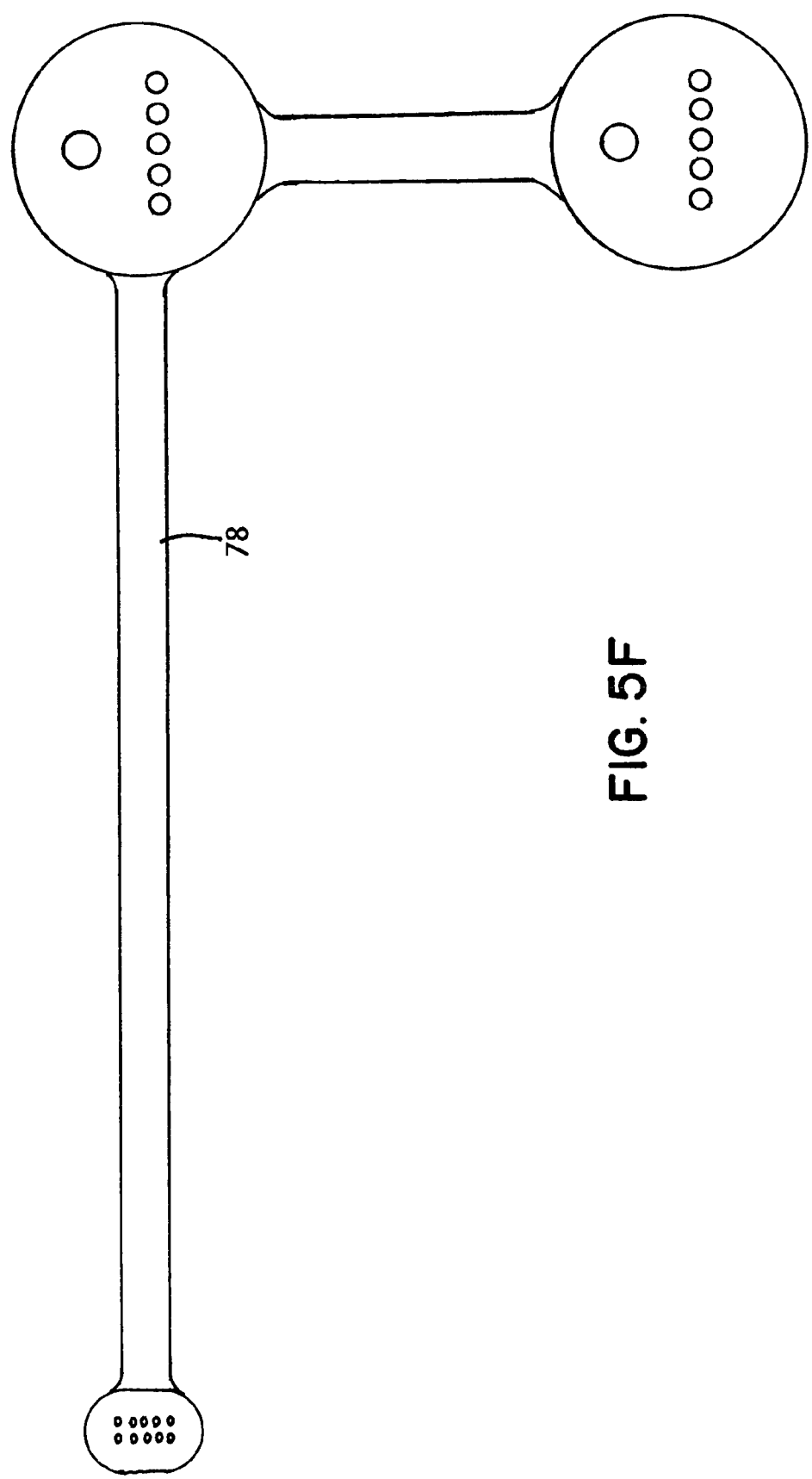
FIG. 5F is a plan view of the stiffener layer of the lead structure of FIG. 5A.
Figure 5G:
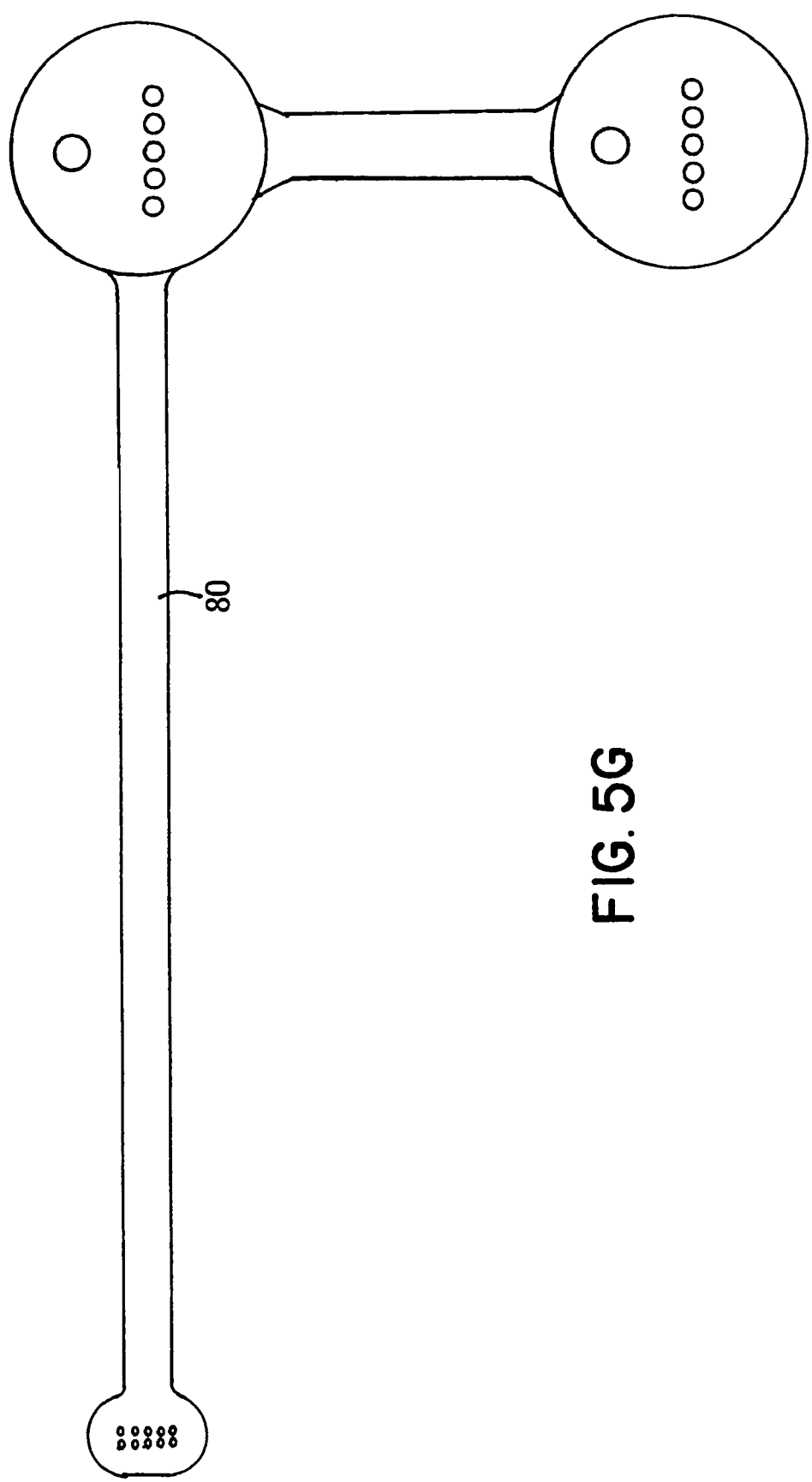
FIG. 5G is a plan view of the second outer polymer layer of the lead structure of FIG. 5A.

When controller body 12 and housing 14 are sealed, enclosing the control valve 22, the pressure sensors 20, controller 60, and flexible circuit 62, as depicted in FIGS. 3A and 4, an interior area free from the harsh exterior environment is formed. To provide electrical connection to the interior area, housing 14 contains an aperture 82 that is sealed by aperture seal 85, which allows electrical connectors 84 to pass through electrical connector apertures 86. Electrical connector seals 88 insert into electrical connector apertures 86 and around electrical connectors 84 to maintain the sealed environment by keeping exterior fluid from entering. Aperture seal 85 may also contain a vent hole 90 into which a porous plastic vent plug 92 is inserted. The vent plug 92 allows the passage of gases so that the internal area of housing 14 may be vented for true atmospheric pressure reference while restricting the flow of liquids into the internal area of the housing 14. Such porous plastic materials are commercially available from Porex Corporation. Pressure transducers 20 also contain vent tubes 93 that open into the vented internal area of housing 14 for true atmospheric pressure reference.

In certain embodiments, the pressure transducers 20, control valve 22, integrated circuit or controller 60, and other necessary or desired electronics are potted with poured epoxy potting. Alternatively, such components may be insert molded into a single unitary chemically inert, non-contaminating material. In this embodiment, the pressure sensors 20 may still be allowed to vent for true atmospheric pressure reference by having the vent tubes 93 extend to the exterior atmosphere. Vent plugs 90 may then be inserted into the ends of vent tubes 93, allowing the passage of gases while restricting the flow of liquids into the pressure sensors 20.

Although the present invention has been shown and described with respect to specific details of certain preferred and other important embodiments thereof, it is not intended that such details limit the scope of the invention, taking into consideration reasonable equivalents thereof.

What is claimed is:

1. A fluid handling device comprising:
    a body formed from chemically inert material and defining a flow passage therethrough;
    a processor with associated control logic;
    at least one sensor in fluid communication with the flow passage, wherein the sensor selectively delivers a signal indicative of a condition of fluid in the flow passage;
    a housing substantially enclosing the processor and the at least one sensor; and
    a resiliently flexible lead structure folded within the housing and electrically communicatively coupling the processor and the at least one sensor to transmit the signal from the at least one sensor to the processor, the lead structure comprising:
        a trace layer presenting first and second opposing surfaces, the trace layer including at least one signal conductor disposed on the first opposing surface, and a shielding conductor disposed on the first opposing surface adjacent the at least one signal conductor and comprising a continuous strip of metallic material circumscribing the at least one signal conductor; and
        a first and a second shielding layer, each shielding layer comprising conductive material on an insulative polymer substrate, the first shielding layer confronting the first opposing surface of the trace layer and the second shielding layer confronting the second opposing surface of the trace layer, the first and second shielding layers being electrically coupled with the shielding conductor of the trace layer, wherein the first and second shielding layers and the shielding conductor of the trace layer define a Faraday cage surrounding the at least one signal conductor to isolate the at least one signal conductor from electromagnetic interference.

2. The fluid handling device of claim 1, wherein each of the shielding layers presents an outer surface and wherein the lead structure further comprises a pair of insulating layers, each of the insulating layers confronting and substantially covering the outer surface of a separate one of the shielding layers.

3. The fluid handing device of claim 2, wherein the insulating layers are made from polymer material.

4. The fluid handling device of claim 1, wherein the lead structure further comprises a stiffening layer.

5. The fluid handling device of claim 1, wherein the device further comprises a second sensor in fluid communication with the flow passage, wherein the second sensor selectively delivers a signal indicative of a condition of fluid in the flow passage, and wherein the second sensor is electrically communicatively coupled with the processor through the lead structure.

6. The fluid handling device of claim 5, wherein the device further comprises a control valve in fluid communication with the flow passage and arranged so as to be operable to modulate fluid flow through the flow passage, wherein the first and second sensors are pressure sensors that deliver a signal indicative of fluid pressure in separate portions of the flow passage, and wherein the processor and associated control logic automatically operate the control valve to modulate fluid flow through the flow passage based on the signals from the first and second sensors.

7. A flow controller comprising:
    an integral body formed from chemically inert material and defining a flow passage therethrough, the flow passage having a wall surface and a pair of opposing ends, the wall surface of the flow passage defining a stop structure intermediate the opposing ends with a first portion of the flow passage extending from a first one of the opposing ends to the stop structure and a second portion of the flow passage extending from the other of the opposing ends to the stop structure;
    an insert defining an orifice for constricting fluid flow through the flow passage, the insert disposed in the first portion of the flow passage abutting the stop structure and being selectively removable through the first end of the flow passage;

a first pressure sensor in fluid communication with the first portion of the flow passage;

a second pressure sensor in fluid communication with the second portion of the flow passage;

a control valve in fluid communication with the flow passage and arranged so as to be operable to modulate fluid flow through the flow passage; and a processor and associated control logic communicatively coupled with the first and second pressure sensors and the control valve, wherein the processor automatically operates the control valve to modulate fluid flow through the flow passage based on signals from the first and second pressure sensors, and wherein the processor and at least one of the first or second pressure sensors are electrically coupled with a flexibly resilient lead structure comprising:

a trace layer including a shielding conductor comprising a continuous strip of metallic material circumscribing at least one signal conductor, the trace layer presenting a pair of opposing surfaces; and a pair of shielding layers, each shielding layer comprising conductive material on an insulative polymer substrate, each of the shielding layers confronting a separate one of the opposing surfaces of the trace layer, the pair of shielding layers being electrically coupled with the shielding conductor of the trace layer, wherein the shielding layers and the shielding conductor of the trace layer define a Faraday cage surrounding the at least one signal conductor to isolate the at least one signal conductor from electromagnetic interference.

8. The flow controller of claim 7, wherein the first portion of the flow passage presents a first cross-sectional area dimension and the second portion of the flow passage presents a second cross-sectional area dimension.

9. The flow controller of claim 7, wherein the stop structure is an annular lip within the flow passage.

10. The flow controller of claim 7, wherein the insert is substantially chemically inert polymer material.

11. The flow controller of claim 10, wherein the chemically inert polymer material is PTFE.

12. The flow controller of claim 7, wherein the insert is substantially sapphire.

13. A flow controller comprising:

a body formed from chemically inert material and defining a flow passage therethrough;

a processor with associated control logic;

a pair of pressure sensors in fluid communication with the flow passage, wherein each sensor selectively delivers a signal indicative of a condition of fluid in the flow passage; and a flexibly resilient lead structure electrically communicatively coupling the processor and the pair of pressure sensors, the lead structure comprising:

a trace layer presenting first and second opposing surfaces, the trace layer including a plurality of signal conductors disposed on the first opposing surface, and a shielding conductor comprising a continuous strip of metallic material circumscribing the plurality of signal conductors; and a first and a second shielding layer, each shielding layer comprising conductive material on an insulative polymer substrate, the first shielding layer confronting the first opposing surface of the trace layer and the second shielding layer confronting the second opposing surface of the trace layer, the first and second shielding layers being electrically coupled with the shielding conductor of the trace layer, wherein the first and second shielding layers and the shielding conductor of the trace layer define a Faraday cage surrounding the plurality of signal conductors to isolate the plurality of signal conductors from electromagnetic interference.

14. The flow controller of claim 13, wherein each of the shielding layers presents an outer surface and wherein the lead structure further comprises a pair of insulating layers, each of the insulating layers confronting and substantially covering the outer surface of a separate one of the shielding layers.

15. The flow controller of claim 14, wherein the insulating layers are made from polymer material.

16. The flow controller of claim 13, wherein the lead structure further comprises a stiffening layer.

17. The flow controller of claim 13, wherein the device further comprises a control valve in fluid communication with the flow passage and arranged so as to be operable to modulate fluid flow through the flow passage, and wherein the processor and associated control logic automatically operate the control valve to modulate fluid flow through the flow passage based on the signals from the pressure sensors.

18. The flow controller of claim 13, wherein the flow passage has a wall surface and a pair of opposing ends, the wall surface of the flow passage defining a stop structure intermediate the opposing ends with a first portion of the flow passage extending from a first one of the opposing ends to the stop structure and a second portion of the flow passage extending from the other of the opposing ends to the stop structure, and wherein the flow controller further comprises an insert defining an orifice for constricting fluid flow through the flow passage, the insert disposed in the first portion of the flow passage abutting the stop structure and being selectively removable through the first end of the flow passage.

19. The flow controller of claim 18, wherein the stop structure is an annular lip within the flow passage.

* * * * *